(12) United States Patent
Sakakibara et al.

(10) Patent No.: US 12,394,586 B2
(45) Date of Patent: Aug. 19, 2025

(54) CHARGED PARTICLE BEAM DEVICE

(71) Applicant: Hitachi High-Tech Corporation, Tokyo (JP)

(72) Inventors: Makoto Sakakibara, Tokyo (JP); Momoyo Enyama, Tokyo (JP); Hajime Kawano, Tokyo (JP); Makoto Suzuki, Tokyo (JP); Kenji Tanimoto, Tokyo (JP); Yuko Sasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 855 days.

(21) Appl. No.: 17/620,970

(22) PCT Filed: Jul. 2, 2019

(86) PCT No.: PCT/JP2019/026275
§ 371 (c)(1),
(2) Date: Dec. 20, 2021

(87) PCT Pub. No.: WO2021/001919
PCT Pub. Date: Jan. 7, 2021

(65) Prior Publication Data
US 2022/0359149 A1 Nov. 10, 2022

(51) Int. Cl.
*H01J 37/14* (2006.01)
*H01J 37/02* (2006.01)
(Continued)

(52) U.S. Cl.
CPC ............ *H01J 37/14* (2013.01); *H01J 37/026* (2013.01); *H01J 37/244* (2013.01); *H01J 37/265* (2013.01); *H01J 37/28* (2013.01)

(58) Field of Classification Search
CPC .. H01J 37/00; H01J 37/02; H01J 37/14; H01J 37/026; H01J 37/244; H01J 37/265;
(Continued)

(56) References Cited

U.S. PATENT DOCUMENTS 4,525,629 A * 6/1985 Morita ................ H01J 37/3007
250/396 ML
5,041,732 A 8/1991 Kenichi et al.
(Continued)

FOREIGN PATENT DOCUMENTS

CN 103733299 A 4/2014
DE 112015001268 T5 1/2017
(Continued)

OTHER PUBLICATIONS

International Search Report, PCT/JP2019/026275, dated Sep. 10, 2019, 2 pgs.
(Continued)

*Primary Examiner* — Jason L McCormack
(74) *Attorney, Agent, or Firm* — Volpe Koenig

(57) ABSTRACT

To provide a charged particle beam device including a booster electrode and an object lens that generates a magnetic field in a vicinity of a sample, and capable of preventing ion discharge, an insulator is disposed between a magnetic field lens and the booster electrode. A tip of the insulator protrudes to a tip side of an upper magnetic path from a tip of a lower magnetic path of the magnetic field lens. The tip on a lower side of the insulator is above the lower magnetic path, and a non-magnetic metal electrode is embedded between the upper magnetic path and the lower magnetic path.

15 Claims, 9 Drawing Sheets

(51) Int. Cl.
*H01J 37/244* (2006.01)
*H01J 37/26* (2006.01)
*H01J 37/28* (2006.01)

(58) Field of Classification Search
CPC .......... H01J 37/26; H01J 37/28; H01J 37/141; H01J 37/04; H01J 2237/0206; H01J 2237/0268; H01J 2237/04735; H01J 2237/28
USPC .......... 250/306, 307, 311, 396 ML
See application file for complete search history.

(56) References Cited

U.S. PATENT DOCUMENTS

| | | | |
|---|---|---|---|
| 5,629,526 A * | 5/1997 | Nakasuji | H01J 37/141 335/210 |
| 5,872,358 A | 2/1999 | Hideo | |
| 6,084,238 A | 7/2000 | Hideo et al. | |
| 6,583,413 B1 | 6/2003 | Hiroyuki et al. | |
| 8,785,879 B1 | 7/2014 | Jürgen | |
| 2008/0067396 A1 | 3/2008 | Takashi et al. | |
| 2009/0256076 A1 | 10/2009 | Fukuda et al. | |
| 2013/0214155 A1 | 8/2013 | Dieter et al. | |
| 2014/0361167 A1 | 12/2014 | Morishita et al. | |
| 2015/0294833 A1 | 10/2015 | Fukuda et al. | |
| 2017/0040139 A1 | 2/2017 | Nomaguchi et al. | |
| 2017/0053777 A1 | 2/2017 | Tomoyasu et al. | |
| 2017/0316915 A1 * | 11/2017 | Okai | H01J 37/14 |
| 2018/0330919 A1 | 11/2018 | Gilad et al. | |
| 2018/0358199 A1 | 12/2018 | Kazuya et al. | |
| 2021/0151279 A1 * | 5/2021 | Imai | H01J 37/145 |
| 2022/0254597 A1 * | 8/2022 | Imai | H01J 37/28 |

FOREIGN PATENT DOCUMENTS

| | | |
|---|---|---|
| JP | H02-297852 A | 12/1990 |
| JP | 2001-243904 A | 9/2001 |
| JP | 2005-317558 A | 11/2005 |
| JP | 2007-311117 A | 11/2007 |
| JP | 2013-058314 A | 3/2013 |
| JP | 2013-138024 A | 7/2013 |
| TW | I557769 B | 11/2016 |
| TW | I588862 B | 6/2017 |
| TW | I592976 B | 7/2017 |
| WO | 2014/069271 A1 | 5/2014 |

OTHER PUBLICATIONS

The Taiwan Office Action, Taiwanese Application No. 109117429, dated Apr. 15, 2021, 4 pgs.
German Office Action issued on May 7, 2025 for German Patent Application No. 112019007399.0.
E. Plies et al., Experimental results using a "low-voltagebooster" in a conventional SEM, Nuclear Instruments and Methods in Physics Research Section A427 (1999), S. 126-130.

* cited by examiner

[FIG. 1]
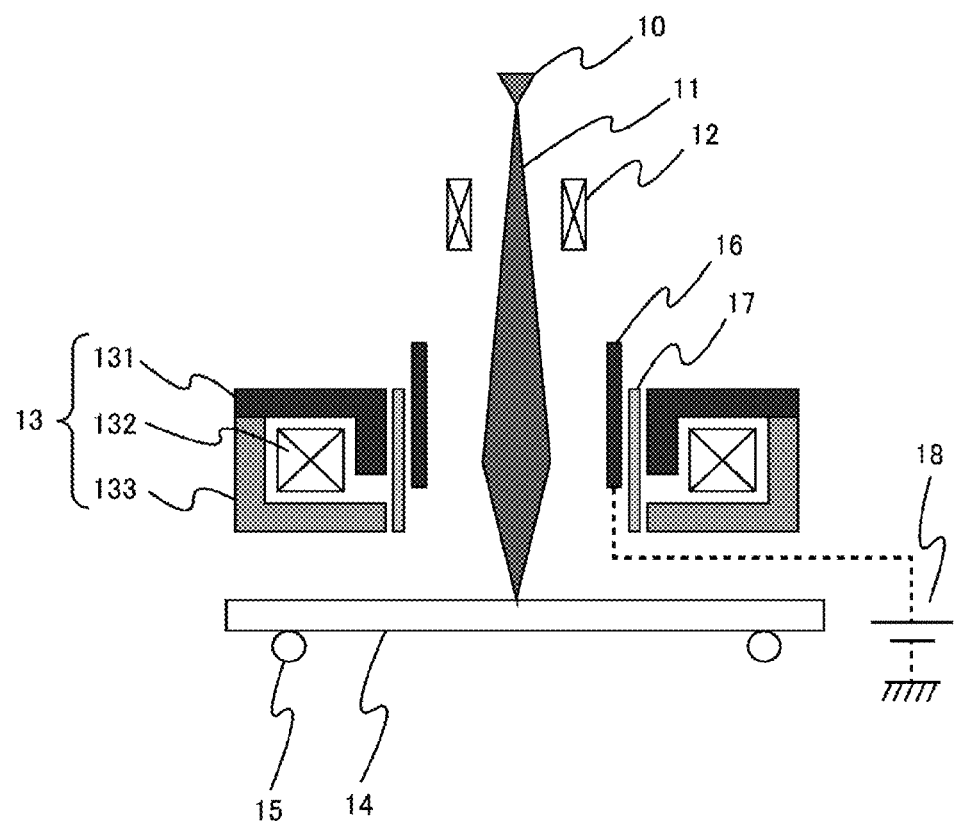

[FIG. 2]
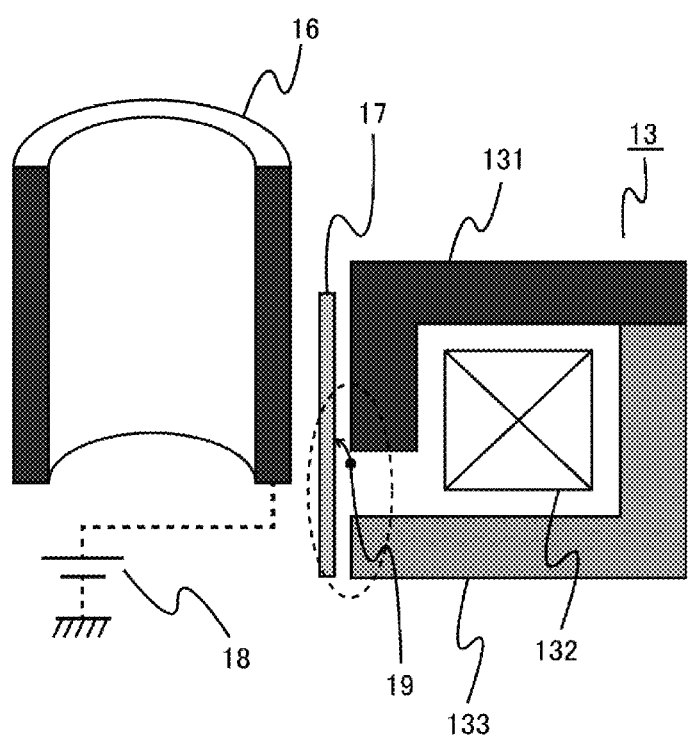

[FIG. 3]
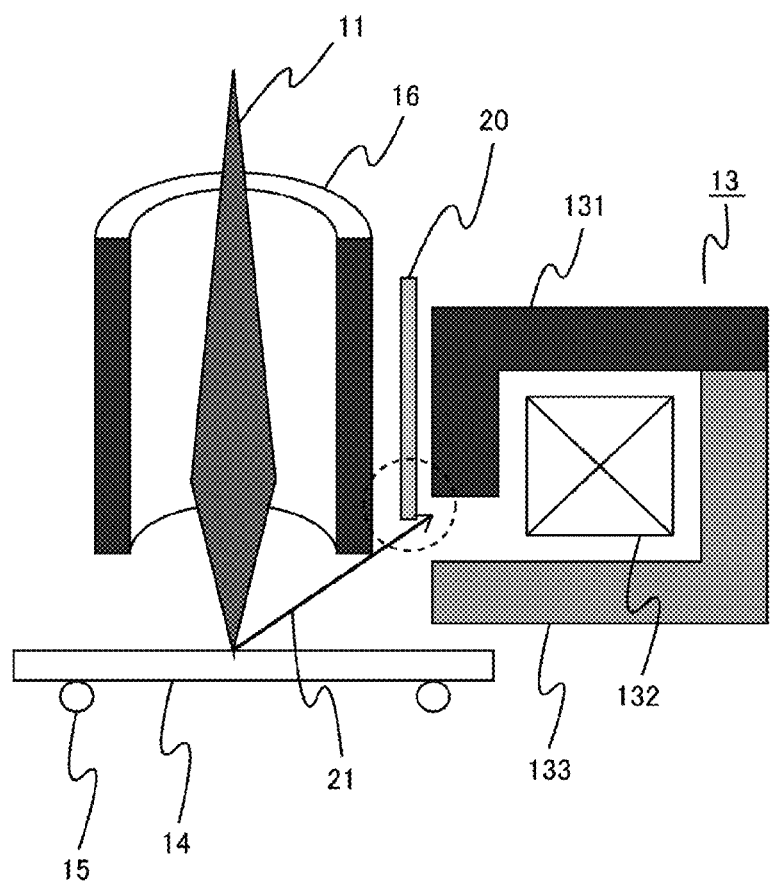

[FIG. 4]
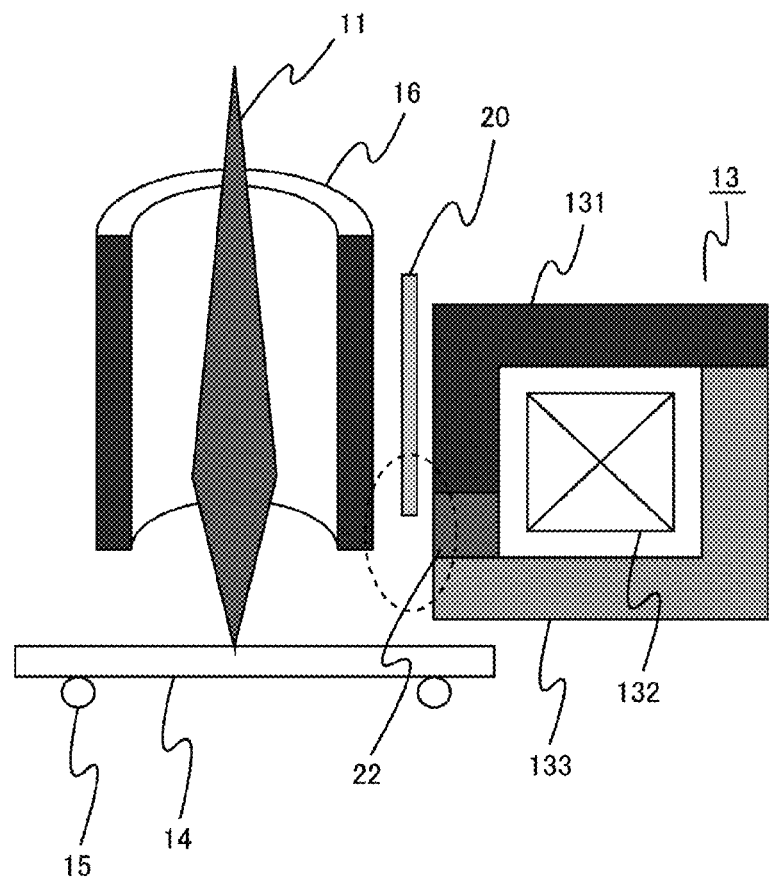

[FIG. 5]
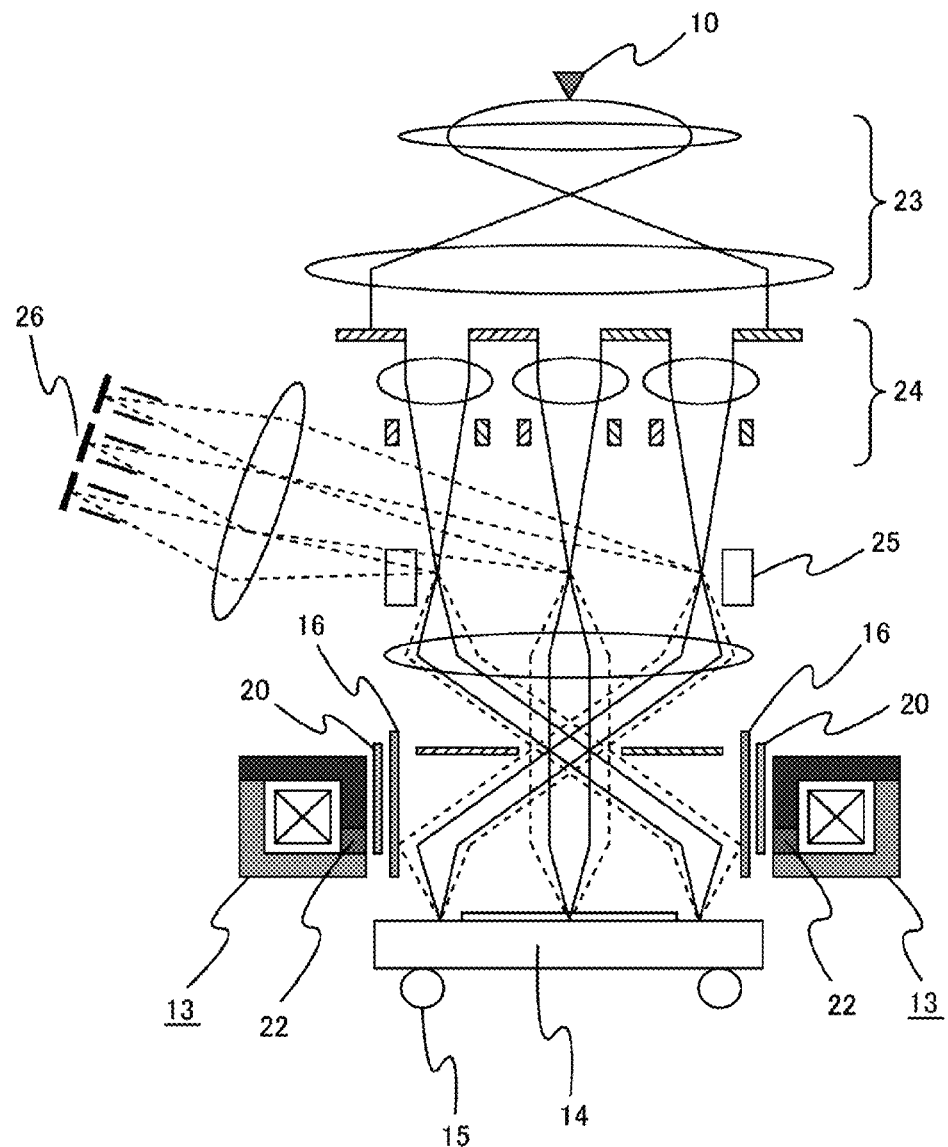

[FIG. 6]
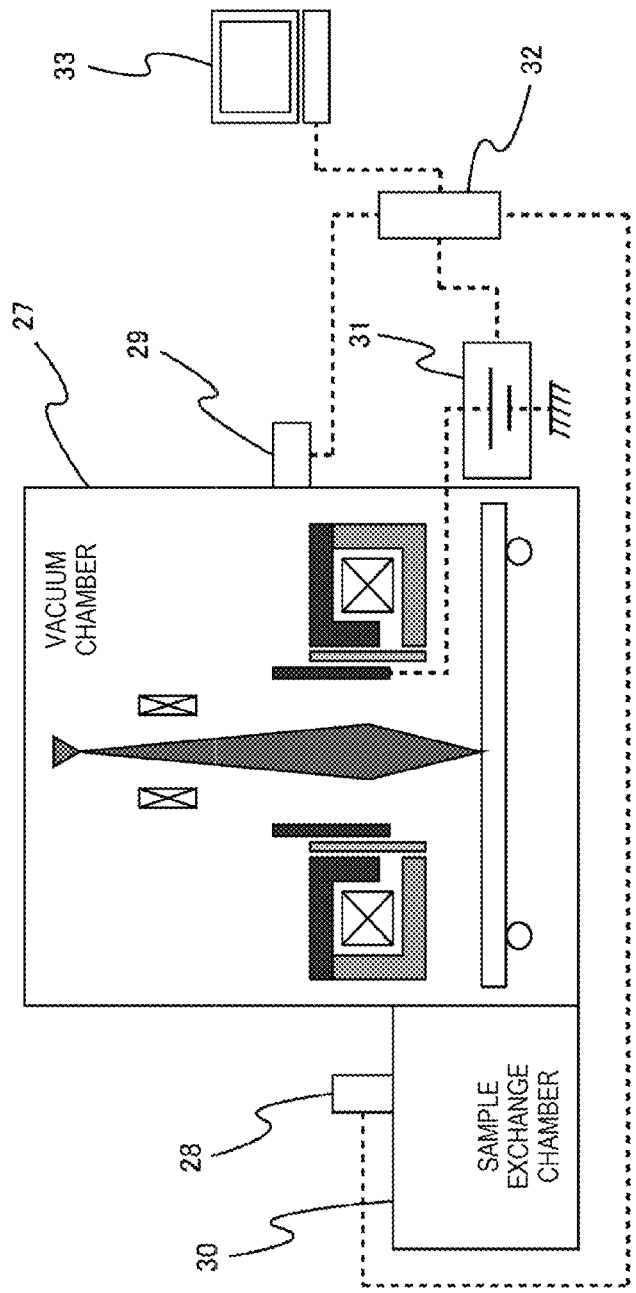

[FIG. 7]
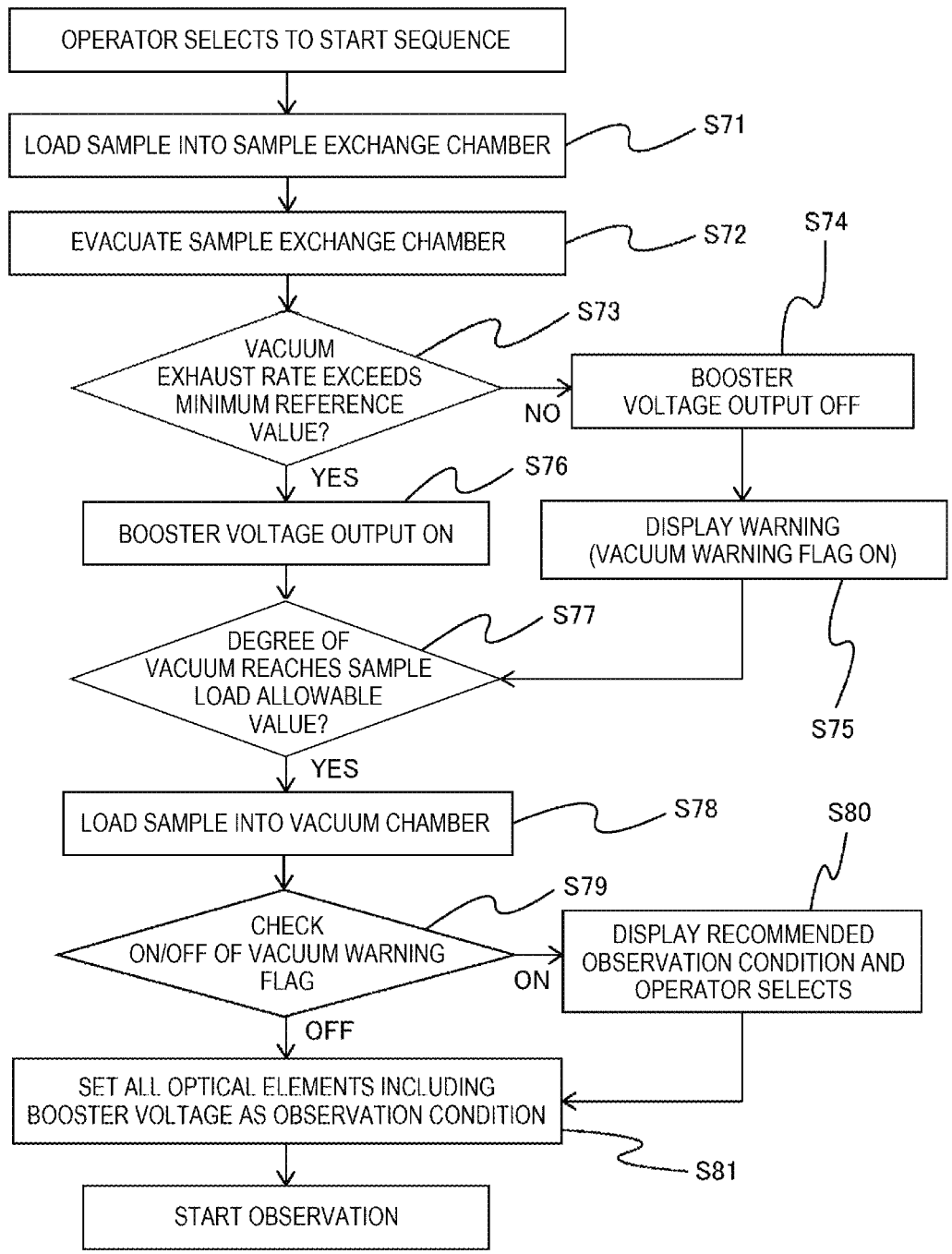

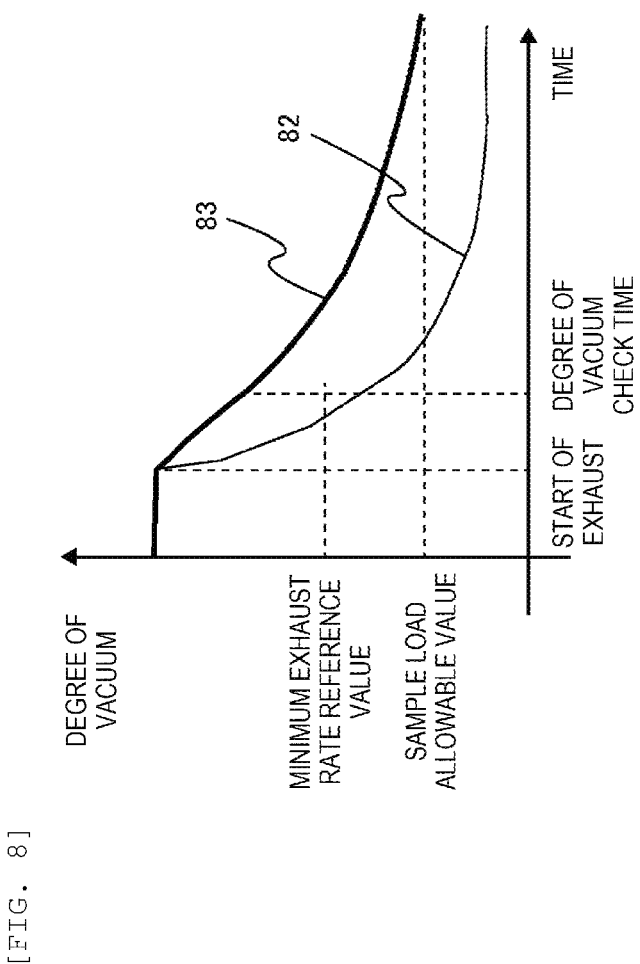

[FIG. 9]
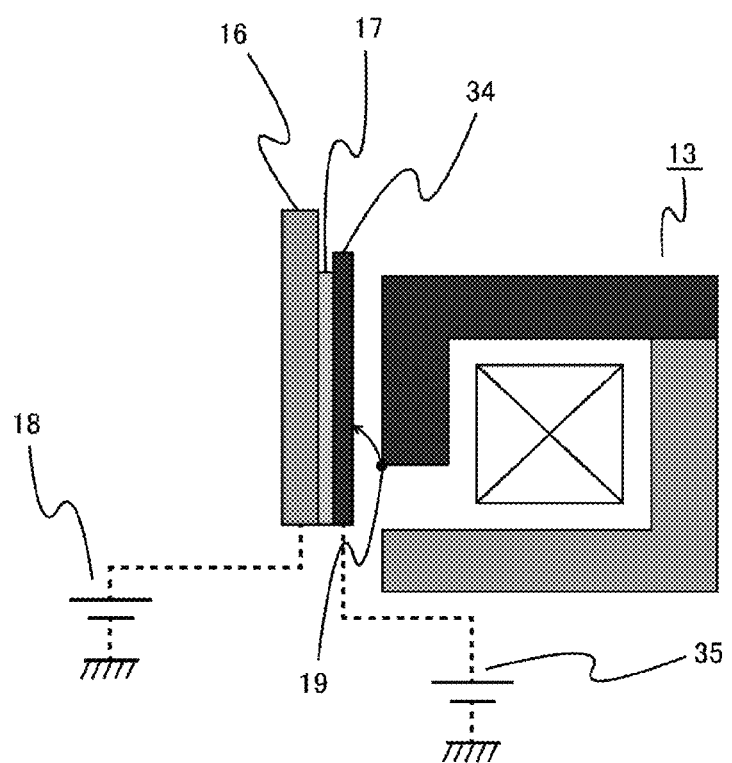

CHARGED PARTICLE BEAM DEVICE

TECHNICAL FIELD

The present invention relates to a charged particle beam device, and more particularly to a charged particle beam device capable of radiating a charged particle beam with low damage and high spatial resolution.

BACKGROUND ART

In a scanning electron microscope (hereinafter, referred to as a SEM) or the like, low acceleration has been advanced to reduce damage to a sample. At low acceleration, resolution deteriorates due to aberration of an optical system. Therefore, a method for accelerating electrons when the electrons pass through a magnetic field lens that converges an electron beam has been devised. An electron beam application device in this method is provided with a booster electrode that applies a positive voltage to accelerate the electron beam.

In a vicinity of the magnetic field lens of the electron beam application device, there are electrons from a sample and electrons of minute discharge due to a booster electric field. These electrons are pulled by the booster electrode having a positive voltage while being subjected to a rotating action by a magnetic field of the magnetic field lens. When the rotating action by the magnetic field is strong, flight time of the electrons is long and a residual gas is ionized. Ions of the generated residual gas also collide with surrounding electrodes under an influence of the booster electric field. These electrons and ions cause a voltage drop and a discharge phenomenon in the booster electrode and the surrounding electrodes.

PTL 1 is an example of the related art. PTL 1 discloses, as a compound magnetic and electrostatic object lens of a charged particle beam device, a configuration that includes yoke members electrically insulated from each other, a control magnetic path member, and a booster magnetic path member, and observes, inspects, and analyzes a wafer sample having a fine circuit pattern at high resolution by using a low-acceleration electron beam.

CITATION LIST

Patent Literature

PTL 1: JP-A-2013-138024

SUMMARY OF INVENTION

Technical Problem

As described above, in the electron beam application device including the magnetic field lens, when the booster electrode is mounted to accelerate the electron beam, electrons generated by a minute discharge, which is not normally a problem, collide with the booster electrode while rotating in the magnetic field. At this time, since the electrons swirl while exciting the residual gas in the space into ions, ion discharge may occur and desired performance as an electron beam application device may not be obtained.

An object of the invention is to solve the above-mentioned problem and to provide a charged particle beam device including a booster electrode and a magnetic field lens that generates a magnetic field in a vicinity of a sample, and capable of preventing ion discharge.

Solution to Problem

In order to achieve the above-mentioned object, the invention provides a charged particle beam device that includes a magnetic field lens and a booster electrode. An insulator is disposed between the magnetic field lens and the booster electrode. A tip of the insulator protrudes to a tip side of one magnetic path from a tip of another magnetic path of the magnetic field lens.

Advantageous Effect

According to the invention, it is possible to provide a charged particle beam device that contracts a space in which charged particles swirl and prevents ion discharge without affecting a booster electric field.

BRIEF DESCRIPTION OF DRAWINGS

FIG. 1 is a diagram showing a schematic configuration of an electron microscope according to a first embodiment.

FIG. 2 is a diagram showing a configuration example of a main part of the electron microscope according to the first embodiment.

FIG. 3 is a diagram showing a configuration example of a main part of an electron microscope according to a second embodiment.

FIG. 4 is a diagram showing a configuration example of a main part of an electron microscope according to a third embodiment.

FIG. 5 is a diagram showing a schematic configuration of a multi-beam device according to the third embodiment.

FIG. 6 is a diagram showing a schematic configuration of an electron microscope system according to a fourth embodiment.

FIG. 7 is a flow chart showing an example of a vacuum exhaust operation of the electron microscope system according to the fourth embodiment.

FIG. 8 is a schematic diagram showing an observation example of a vacuum exhaust rate of the electron microscope system according to the fourth embodiment.

FIG. 9 is a diagram showing a configuration example of a main part of an electron microscope according to a fifth embodiment.

DESCRIPTION OF EMBODIMENTS

Hereinafter, embodiments for carrying out the invention will be sequentially described with reference to the drawings. The same components are numbered the same in a plurality of drawings in principle. In the following embodiments, an electron microscope is shown as an example of a charged particle beam device. Alternatively, the invention can also be applied to other charged particle beam devices such as an electron beam drawing device.

First Embodiment

A first embodiment is an embodiment of a charged particle beam device that includes a magnetic field lens and a booster electrode. An insulator is disposed between the magnetic field lens and the booster electrode. A tip of the insulator protrudes to a tip side of one magnetic path from a tip of another magnetic path of the magnetic field lens.

FIG. 1 is a diagram showing a schematic cross-sectional configuration of an electron microscope that is a configuration example of the charged particle beam device according to the first embodiment. An electron beam 11 emitted from an electron source 10 that is a charged particle beam source is appropriately deflected by a deflector 12, passes through a magnetic field lens 13 constituting an object lens, and becomes an electron probe with which a sample is irradiated. A sample stage 14 on which the sample to be irradiated with the electron probe is placed is driven in an X-Y direction by sample stage driving mechanisms 15 to select a field of view or the like. As shown in FIG. 1, the magnetic field lens 13 includes an upper magnetic path 131, a coil 132, and a lower magnetic path 133. The magnetic field lens has a configuration in which the coil 132 is confined by a magnetic path such as a soft magnetic material, and a gap is provided in the magnetic path at a space position where a magnetic field is to be formed. In the present description, a place where two magnetic paths face each other with the gap therebetween is referred to as "a tip of a magnetic path."

As shown in FIG. 1, a booster electrode 16, to which a positive booster voltage 18 is applied, and an insulator 17 are installed around an optical axis of the device on an inner side of the magnetic field lens 13 to accelerate the electron beam. A retarding voltage (not shown) is applied to the sample stage 14.

As described above, in a vicinity of the magnetic field lens 13, there are electrons from the sample and electrons of minute discharge due to a booster electric field of the booster electrode 16. These electrons are pulled by the booster electrode 16 having a positive voltage while being subjected to a rotating action by the magnetic field. When flight time is long, a residual gas is ionized as described above. The generated ions also collide with surrounding electrodes under an influence of the booster electric field. These electrons and ions cause a voltage drop and a discharge phenomenon in the booster electrode and the surrounding electrodes. More specifically, in a case of an out-lens type object lens structure, even though a space withstand voltage is 20 kV or more, discharge occurs even at 5 kV or less due to ion discharge caused by an application of the magnetic field. Such a phenomenon is particularly remarkable when observing a sample having a large amount of outgas.

FIG. 2 shows a configuration example of a periphery of the magnetic field lens 13 and the booster electrode 16, which is a main part of the electron microscope according to the first embodiment. As shown in FIG. 2, the insulator 17 disposed between the magnetic field lens 13 and the booster electrode 16 has a configuration of covering tips of the upper magnetic path 131 and the lower magnetic path 133 of the magnetic field lens 13. This configuration contracts a space in which electrons 19 due to the minute discharge swirl and prevents floating of the electrons 19. Further, a material that inhibits release of the electrons may be applied to a vicinity of tips of magnetic materials constituting the upper magnetic path 131 and the lower magnetic path 133 to further prevent the electrons from being generated due to the minute discharge.

Second Embodiment

A second embodiment is an embodiment of a charged particle beam device in which an insulator disposed between a magnetic field lens and a booster electrode covers only a tip of at least one magnetic pole so that the insulator is not charged when electrons are radiated from another place to a sample placed on a sample stage. In other words, a tip of the insulator is placed between a tip of one magnetic path and a tip of another magnetic path of the magnetic field lens. More specifically, the tip on a lower side of the insulator protrudes to a lower magnetic path side from a tip of an upper magnetic path of the magnetic field lens, and the tip on the lower side of the insulator is disposed above the lower magnetic path of the magnetic field lens.

FIG. 3 is a diagram showing a main part of an electron microscope of the second embodiment. Numbers common to those in FIGS. 1 and 2 indicate the same components. As shown in FIG. 3, in a part surrounded by a dotted circle, in order to prevent the insulator from being charged by electrons 21 flying from a sample on the sample stage 14 due to irradiation of the electron beam 11, an insulator 20 shown in FIG. 3 has a configuration of covering only the upper magnetic path 131 of the magnetic field lens 13, unlike the insulator 17 shown in FIGS. 1 and 2. According to the configuration of the present embodiment, it is possible to reduce or prevent the insulator 20 from being charged and prevent an adverse effect of electrons of minute discharge, which is an original effect of providing the insulator 20.

Further, in the configuration of the present embodiment, an antistatic film that prevents charging may be formed on a surface of the insulator 20. As the antistatic film, a spray type film having a semi-conductor film formed on the surface of the insulator 20 may be used.

Third Embodiment

A third embodiment is an embodiment of a charged particle beam device in which a non-magnetic metal electrode is disposed between an upper magnetic path and a lower magnetic path of a magnetic field lens to make an electric field in a vicinity of a tip of an insulator parallel and uniform.

FIG. 4 is a diagram showing a configuration example of a main part of an electron microscope of the third Embodiment. As shown in FIG. 4, a non-magnetic metal electrode 22 is disposed between a tip of the upper magnetic path 131 of the magnetic field lens 13 and a tip of the lower magnetic path 133. The non-magnetic metal electrode 22 is connected to a predetermined potential point such as grounding. The non-magnetic metal electrode 22 allows an electric field in a region surrounded by a dotted ellipse, that is, in the vicinity of the tip on a lower side of the insulator 20, to be parallel and uniform. Accordingly, by strengthening the electric field, it is possible to prevent rotation of electrons due to the magnetic field, prevent a discharge phenomenon, and maintain a voltage up to a higher voltage.

The configurations of the electron microscopes of the first embodiment to the third embodiment described above are described with a basic configuration using a single beam. Alternatively, the embodiments are not limited to a single beam and can be applied to a charged particle beam device such as a high-speed SEM or an electron beam drawing device having a multi-beam configuration that achieves both resolution and a large field of view.

FIG. 5 shows a configuration example of a charged particle beam device such as a high-speed SEM or an electron beam drawing device having a multi-beam configuration and the configuration of the third embodiment. The charged particle beam device having a multi-beam configuration includes a radiation lens disposed downstream of a charged particle beam source such as an electron source and configured to radiate a charged particle beam, a multi-beam forming unit disposed downstream of the radiation lens and configured to form multiple beams from the charged particle beam, a beam separator disposed downstream of the multi-beam forming unit, a focusing lens disposed downstream of the beam separator, a multi-detector configured to detect secondary charged particles separated by the beam separator, and the like. In the present description, the downstream is similar to a lower side, and means a side from the charged particle beam source toward the sample.

That is, in the charged particle beam device having a multi-beam configuration shown in FIG. 5, an electron beam from the electron source 10 is incident on a multi-beam forming unit 24 via a radiation lens 23 to form multiple beams. The multiple beams radiate the sample through a beam separator 25, a focusing lens, an aperture, the magnetic field lens 13 that is an object lens, and the like that are disposed downstream of the multi-beam forming unit 24. Secondary electrons generated in the sample follow a reverse path and are sent by the beam separator 25 to corresponding multi-detectors 26. In such a multi-beam configuration, similarly to the configuration shown in FIG. 4, the magnetic field lens 13 has a configuration in which the non-magnetic metal electrode 22 is provided between the tip of the upper magnetic path 131 and the tip of the lower magnetic path 133 of the magnetic field lens 13, and can obtain the effect of the present embodiment described with reference to FIG. 4 together with the booster electrode 16 and the insulator 20.

Although illustration and description are omitted here, the configurations of the first and second embodiments described with reference to FIGS. 1 to 3 can also be applied to a charged particle beam device having a multi-beam configuration as shown in FIG. 5, and desired effects of the first and second embodiments can be obtained.

Fourth Embodiment

A fourth embodiment is an embodiment of an electron microscope system having a sequence of observing a change in a vacuum gauge of an electron microscope when a sample having a large amount of outgas such as a resist is irradiated with electrons and changing application time of a booster voltage based on a measured value of the vacuum gauge. That is, the fourth embodiment is an embodiment of an electron microscope system that includes a control unit configured to monitor a pressure change of the device during vacuum exhaust when a sample is introduced into the device and to control an application sequence of a booster voltage to a booster electrode based on a monitoring result. Further, the fourth embodiment is an embodiment of an electron microscope system in which the control unit thereof performs control to display a warning when a degree of vacuum does not exceed a reference value after predetermined time from a start of exhaust based on a measured value of a vacuum gauge that measures a pressure change of the device during exhaust.

As shown in FIG. 6, the electron microscope configuration of the first embodiment shown in FIG. 1 is disposed inside a vacuum chamber 27. It is apparent that the invention can be provided with not only the electron microscope having the configuration of the first embodiment but also those having the configurations of the second and third embodiments shown in FIGS. 2 to 5. In addition, as shown in FIG. 6, a Vb power supply 31 that applies the booster voltage to the booster electrode is disposed outside the vacuum chamber 27.

As shown in FIG. 6, a sample exchange chamber 30 is attached to the vacuum chamber 27. The sample exchange chamber 30 and the vacuum chamber 27 are provided with a vacuum gauge A28 and a vacuum gauge B29, respectively. Measured values of the vacuum gauge A28 and the vacuum gauge B29 are input to a control board 32 that is a control unit that controls the electron microscope system. The control board 32 sends the measured values to an operator console 33 and displays the measured values on a display unit of the operator console, and controls a value of the booster voltage applied to the booster electrode by the Vb power supply 31 based on the measured values. Then, when it is determined that there is a large amount of outgas from the sample based on the measured value or the like of the vacuum gauge B29, the control board 32 can display a warning on the display unit of the operator console 33 and perform control to not apply the booster voltage to the booster electrode.

A method for controlling the electron microscope system by the control board 32, which is the control unit described above, will be described with reference to FIGS. 7 and 8. In FIG. 7, when an operator selects to start the sequence by the operator console 33, the control board 32 performs control to load the sample into the sample exchange chamber 30 (hereinafter, step S71), and then performs control to evacuate the sample exchange chamber 30 (S72). Then, based on the input measured values of the vacuum gauges, the control board 32 checks whether a vacuum exhaust rate exceeds a minimum reference value (S73).

FIG. 8 shows an observation example of a vacuum exhaust rate. In FIG. 8, a horizontal axis shows exhaust time, and a vertical axis shows a degree of vacuum (pressure) in the device. As shown in FIG. 8, the pressure in the device gradually decreases with lapse of time from the start of exhaust. In an exhaust characteristic 82 in the case of a standard sample, a degree of vacuum check time after predetermined time from the start of exhaust exceeds a minimum exhaust rate reference value on the vertical axis indicating the degree of vacuum. Therefore, the control unit determines that the vacuum exhaust rate exceeds the minimum reference value (YES) in S73, and performs an output ON control of the boost voltage (S76).

In contrast, since an exhaust characteristic 83 in the case of a sample having a large amount of outgas does not exceed the minimum exhaust rate reference value in the degree of vacuum check time, the control unit determines in S73 that the vacuum exhaust rate does not exceed the minimum reference value (NO), performs an output OFF control of the booster voltage (S74), turns a vacuum warning flag ON, and displays a warning (S75).

Further, the control board 32 determines whether the degree of vacuum in the vacuum chamber 27 reaches a sample load allowable value based on the measured values of the vacuum gauges (S77), and loads the sample into the vacuum chamber 27 (S78) when the degree of vacuum reaches the sample load allowable value (YES). Then, the control board 32 checks ON/OFF of the vacuum warning flag (S79). When the vacuum warning flag is ON, the control board 32 displays a recommended observation condition on the operator console 33 so that the operator makes an appropriate selection (S80). When the vacuum warning flag is OFF, the control board 32 sets all optical elements including the booster voltage as the observation condition (S81), and starts observation by the electron microscope in the vacuum chamber 27.

That is, according to the present embodiment, after loading the sample into the vacuum chamber 27, the control board 32 performs control to set the observation condition of the device when the warning display is OFF, and thus it is possible to provide an electron microscope system that enables appropriate observation of a sample according to the amount of outgas.

Fifth Embodiment

A fifth embodiment is an embodiment of a charged particle beam device including a discharge electrode disposed between an insulator and a magnetic field lens, and a discharge countermeasure power supply that applies a discharge countermeasure voltage to the discharge electrode. That is, the fifth embodiment is an embodiment of a charged particle beam device in which a discharge electrode is provided as a second electrode that absorbs electrons discharged from a magnetic field coil, and a voltage drop of the booster electrode can be prevented by the configuration of the present embodiment.

FIG. 9 shows a configuration example of the charged particle beam device of the fifth embodiment. In FIG. 9, a discharge electrode 34 is disposed as a second electrode between the booster electrode 16 and the insulator 17 and an electromagnetic coil 13, and a discharge countermeasure voltage is applied to the discharge electrode 34 from a discharge countermeasure power supply 35. Accordingly, the electrons 19 discharged from the magnetic field coil 13 can be attracted by the discharge electrode 34, and the voltage drop of the booster electrode 16 to which the booster voltage 18 is applied can be prevented.

The invention is not limited to the various embodiments described above and includes various modifications. For example, by combining the above-mentioned embodiments, it is possible to provide a charged particle beam device having higher performance. Further, the above-mentioned embodiments are described in detail for a better understanding of the invention, and are not necessarily limited to those including all the configurations described above.

Furthermore, a part or all of the above-mentioned configurations, functions, control boards, and the like may be implemented by hardware by designing an integrated circuit such as an application specific integrated circuit (ASIC) or a field programmable gate array (FPGA), or be implemented by creating a central processing unit (CPU) that executes a desired function program.

REFERENCE SIGN LIST 10 electron source
11 electron beam
12 deflector
13 magnetic field lens
131 upper magnetic path
132 coil
133 lower magnetic path
14 sample stage
15 sample stage driving mechanism
16 booster electrode
17, 20 insulator
18 booster voltage
19, 21 electron
22 non-magnetic metal electrode
23 radiation lens
24 multi-beam forming unit
25 beam separator
26 multi-detector
27 vacuum chamber
28, 29 vacuum gauge A, vacuum gauge B
30 sample exchange chamber
31 Vb power supply
32 control board
33 operator console
34 discharge electrode
35 discharge countermeasure power supply

The invention claimed is:

1. A charged particle beam device comprising:
a magnetic field lens; and
a booster electrode, wherein
an insulator is disposed between the magnetic field lens and the booster electrode, and
a tip of the insulator protrudes to a tip side of one magnetic path from a tip of another magnetic path of the magnetic field lens.

2. The charged particle beam device according to claim 1, wherein
the tip of the insulator is placed between the tip of the one magnetic path and the tip of the other magnetic path of the magnetic field lens.

3. The charged particle beam device according to claim 1, wherein
an antistatic film that prevents charging is formed on a surface of the insulator.

4. The charged particle beam device according to claim 1, wherein
a non-magnetic metal electrode is disposed between the tip of the one magnetic path and the tip of the other magnetic path of the magnetic field lens.

5. The charged particle beam device according to claim 1, further comprising:
a discharge electrode disposed between the insulator and the magnetic field lens; and
a discharge countermeasure power supply configured to apply a discharge countermeasure voltage to the discharge electrode.

6. The charged particle beam device according to claim 1, further comprising:
a control unit configured to monitor a pressure change of the device during vacuum exhaust when a sample is introduced into the device and to control an application sequence of a booster voltage to the booster electrode based on a monitoring result.

7. The charged particle beam device according to claim 6, further comprising:
a display unit; and
a vacuum gauge configured to measure a degree of vacuum of the device during vacuum exhaust.

8. The charged particle beam device according to claim 7, wherein
the control unit perform controls to turn off an output of the booster voltage and display a warning on the display unit when the degree of vacuum does not exceed a reference value after predetermined time from a start of exhaust based on a measured value of the vacuum gauge.

9. The charged particle beam device according to claim 7, wherein
the control unit performs control to turn on an output of the booster voltage when the degree of vacuum exceeds a reference value after predetermined time from a start of exhaust based on a measured value of the vacuum gauge.

10. The charged particle beam device according to claim 7, wherein
the control unit perform controls to load the sample into a vacuum chamber when the degree of vacuum reaches a sample load allowable value based on a measured value of the vacuum gauge.

11. The charged particle beam device according to claim 1, further comprising:
- a charged particle beam source configured to generate a charged particle beam;
- a radiation lens disposed downstream of the charged particle beam source and configured to radiate the charged particle beam;
- a multi-beam forming unit disposed downstream of the radiation lens and configured to form multiple beams from the charged particle beam;
- a beam separator disposed downstream of the multi-beam forming unit;
- a focusing lens disposed downstream of the beam separator; and
- a multi-detector configured to detect secondary charged particles separated by the beam separator, wherein
- the magnetic field lens, the booster electrode, and the insulator are disposed downstream of the focusing lens.

12. The charged particle beam device according to claim 11, wherein
the tip of the insulator is placed between the tip of the one magnetic path and the tip of the other magnetic path of the magnetic field lens.

13. The charged particle beam device according to claim 11, wherein
an antistatic film that prevents charging is formed on a surface of the insulator.

14. The charged particle beam device according to claim 11, wherein
a non-magnetic metal electrode is disposed between the tip of the one magnetic path and the tip of the other magnetic path of the magnetic field lens.

15. The charged particle beam device according to claim 11, further comprising:
- a discharge electrode disposed between the insulator and the magnetic field lens; and
- a discharge countermeasure power supply configured to apply a discharge countermeasure voltage to the discharge electrode.

* * * * *